United States Patent [19]

Murakoshi et al.

[11] Patent Number: 5,598,025
[45] Date of Patent: Jan. 28, 1997

[54] SEMICONDUCTOR DEVICE COMPRISES AN IMPURITY LAYER HAVING BORON IONS IN THE FORM OF CLUSTERS OF ICOSAHEDRON STRUCTURE

[75] Inventors: Atsushi Murakoshi, Kawasaki; Ichiro Mizushima, Yokohama; Masaharu Watanabe, Kawasaki; Masahiko Yoshiki, Yokohama, all of Japan

[73] Assignee: Kabushiki Kaisha Toshiba, Kawasaki, Japan

[21] Appl. No.: 392,481

[22] Filed: Feb. 23, 1995

Related U.S. Application Data

[62] Division of Ser. No. 997,363, Dec. 28, 1992, Pat. No. 5,413,943.

[30] Foreign Application Priority Data

Dec. 27, 1991 [JP] Japan ................................ 3-346544
Dec. 9, 1992 [JP] Japan ................................ 4-329401

[51] Int. Cl.⁶ .................. H01L 29/167; H01L 29/307; H01L 29/227
[52] U.S. Cl. ................ 257/607; 257/66; 257/655
[58] Field of Search .................. 257/66, 607, 655

[56] References Cited

U.S. PATENT DOCUMENTS

| | | | |
|---|---|---|---|
| 4,216,030 | 8/1980 | Graul | 437/20 |
| 4,329,773 | 5/1982 | Geipel, Jr. et al. | 437/20 |
| 4,732,866 | 3/1988 | Chruma et al. | |
| 4,968,634 | 11/1990 | Kuhlmann | 437/20 |
| 5,108,954 | 4/1992 | Sandhu | 437/26 |
| 5,178,980 | 1/1993 | Mort et al. | 430/58 |
| 5,213,986 | 5/1993 | Pinker et al. | 437/20 |

FOREIGN PATENT DOCUMENTS 2053785 12/1971 Germany.
3151437 7/1983 Germany.

OTHER PUBLICATIONS

D. W. Bullet, "The Electronic Origin Of Disorder In Boron And Boron–Rich Borides", AIP Conference Proceedings 231, AIP, New York 1991.

Y. Sato et al., Extended Abstracts for the 29th Spring Meeting, Apr. 3, 1982, 3p–Q–14, The Japan Society Of Applied Physics And Related Societies.

S. Ghandi, "VLIS Fabrication Principles", 1983, pp. 325–328.

Primary Examiner—Ngân V. Ngô
Attorney, Agent, or Firm—Foley & Lardner

[57] ABSTRACT

An impurity diffusion layer shallow in diffusion depth and high in activity is formed in a semiconductor device. In the semiconductor device, clusters of icosahedron structure each composed of boron atoms are formed in the silicon crystal of the impurity layer of the semiconductor device so as to function as acceptors. Further, after the clusters of icosahedron structure each composed of 12 boron atoms have been formed by implanting boron ions at high concentration, the device is processed at temperature lower than 700° C. to prevent the boron from being decreased due to combination with silicon. Since an impurity layer shallow in diffusion from the substrate surface and high in activity can be formed and further the clusters of icosahedron structure each composed of 12 boron atoms can be utilized as acceptors, it is possible to realize a high doping even in the manufacturing process for the devices not suitable for high temperature annealing.

3 Claims, 16 Drawing Sheets

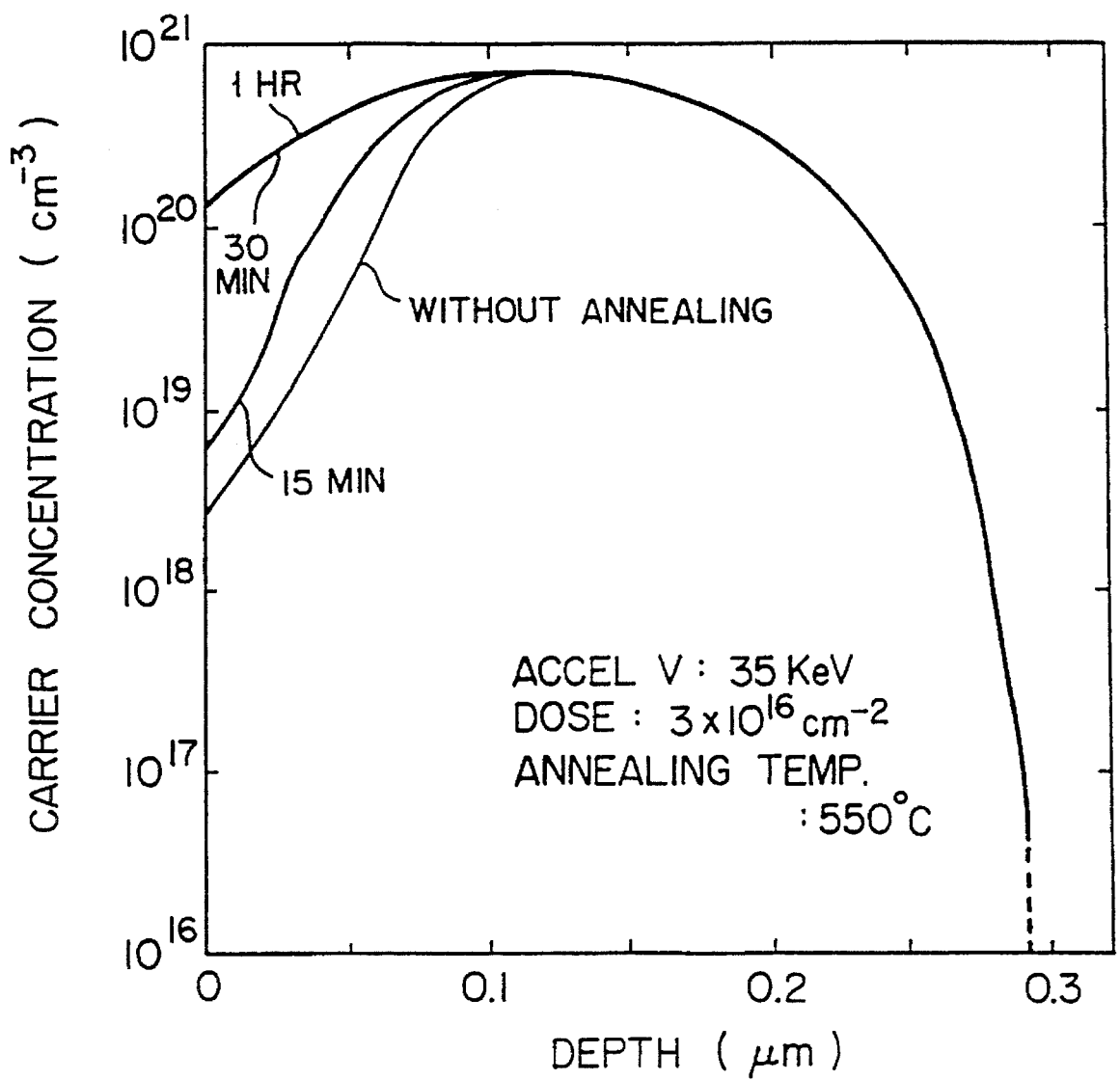
F I G. 3

SEMICONDUCTOR DEVICE COMPRISES AN IMPURITY LAYER HAVING BORON IONS IN THE FORM OF CLUSTERS OF ICOSAHEDRON STRUCTURE

This application is a division, of application Ser. No. 07/997,363, filed Dec. 28, 1992, now U.S. Pat. No. 5,413,943.

BACKGROUND OF THE INVENTION

1. Field of the Invention

The present invention relates to a semiconductor device provided with an impurity layer having carriers formed through a low temperature process, and a method of manufacturing a semiconductor device which can form carriers in an impurity diffused layer in accordance with a low temperature process.

2. Description of the Prior Art

With the advance of the microminiaturization and higher integration of MOS integrated circuit elements, the areas of conduction portions for connecting metallic wires to polycrystalline silicon layers, gate electrodes, drain diffusion layers, etc. have become extremely smaller. With a result of this tendency, there arises a serious problem in that the contact resistance of the wiring increases more and more.

The contact resistance per-unit area is determined by the difference in work function between the metal and the semiconductor and further by the concentration of impurity ions electrically activated in the semiconductor substrate. In order to reduce the contact resistance, it is preferable to decrease the difference in work functions between the metal and the semiconductor and to increase the impurity ion concentration of the semiconductor. Therefore, as a method of increasing the concentration of impurity ions electrically activated in the semiconductor, there has been so far known the method of forming an activated impurity layer by annealing at a high temperature a semiconductor substrate into which impurity ions have been implanted.

However, in the above-mentioned prior art method of implanting impurity ions into a semiconductor substrate and then annealing the semiconductor substrate at a high temperature so that the impurity ions can function as donors or acceptors, it has been impossible to increase the activated impurity ion concentration beyond the solid solution limit determined at the annealing temperature. Accordingly, since the impurity ions diffuse deeper and deeper during the high temperature treatment, there exists a problem in that the impurity atom concentration is reduced and the junction depth of the diffused layer becomes deep.

SUMMARY OF THE INVENTION

With these problems in mind, therefore, it is the object of the present invention to provide a semiconductor device of high in activation degree of the impurity diffusion layer and shallow in diffusion depth of the impurity layer, and a method of manufacturing the above-mentioned semiconductor device.

To achieve the above-mentioned object, the semiconductor device according to the present invention comprises a silicon layer; and an impurity layer formed in the silicon layer and including boron ions in such a way that at least a part of boron ions are included in the form of clusters of icosahedron structure each composed of 12 boron atoms.

In the method of manufacturing a semiconductor device according to the present invention comprises the steps of: forming an impurity layer in a silicon layer at a concentration in such a way that at least a part of boron ions are included in the form of clusters of icosahedron structure each composed of 12 boron atom; and forming a functional portion by use of the formed impurity layer.

In the semiconductor device according to the present invention, the clusters of icosahedron structure each composed of 12 boron atom are formed in the impurity diffusion layer of the semiconductor, and the formed clusters provide holes and therefore function as acceptors. The clusters are formed by implanting boron ions or by decomposing compound including boron.

In the method of the present invention, it is possible to form an impurity layer of hole conductive type having a high carrier concentration through an extremely low temperature process, in comparison with the prior art method which requires relatively high temperature annealing process.

BRIEF DESCRIPTION OF THE DRAWINGS

FIG. 3 is a graphical representation showing profiles of carrier concentration in the depth direction obtained when the semiconductor device is heat-treated at 550° C. within a nitrogen atmosphere with the annealing time as a parameter, in comparison with that obtained before annealing;

DETAILED DESCRIPTION OF THE PREFERRED EMBODIMENTS

The embodiments of the semiconductor device according to the present invention will be described hereinbelow.

Figure 1A:
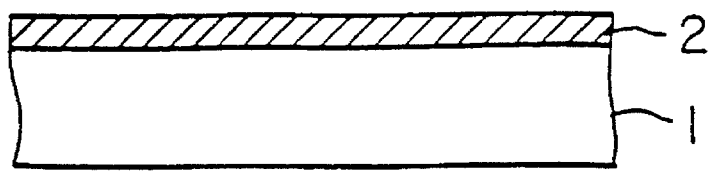
FIGS. 1A to 1E are cross-sectional views showing the manufacturing process of the semiconductor device according to the present invention.
Figure 1B:
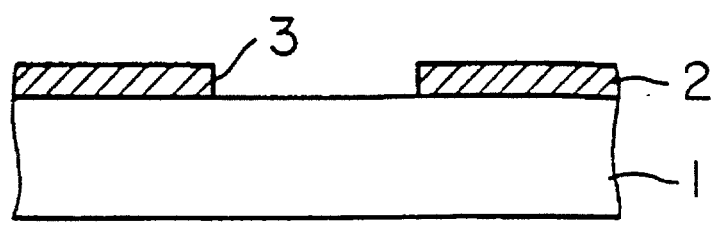
Figure 1C:
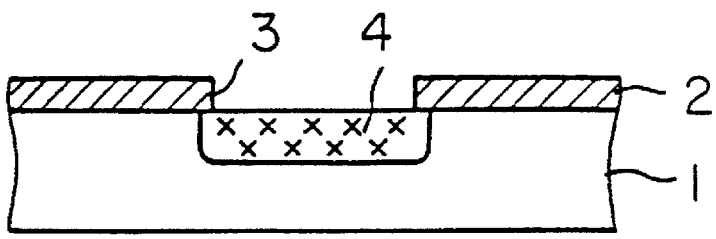
Figure 1D:
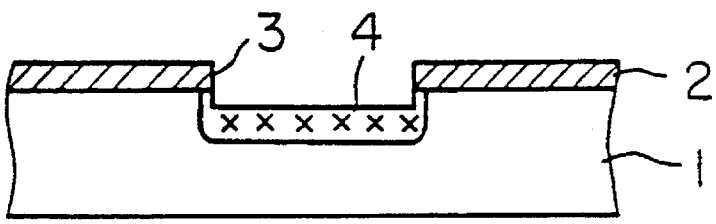
Figure 1E:
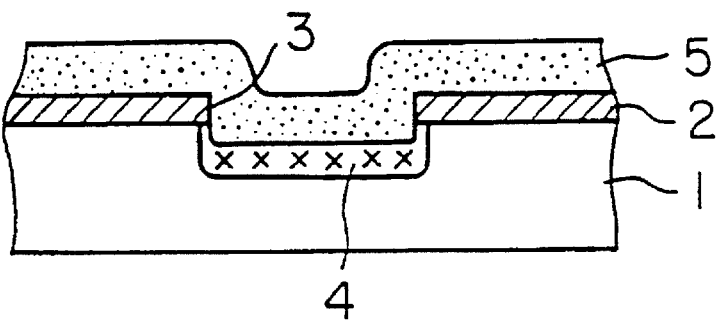

FIGS. 1A to 1E show exemplary steps of the manufacturing a semiconductor device element in accordance with the method according to the present invention. As shown in FIG. 1A, a silicon dioxide film 2 with a thickness of 400 nm is deposited on a single crystalline silicon substrate 1 in accordance with a CVD (chemical vapor deposition) technique. Successively, as shown in FIG. 1B, a contact hole 3 of a 1 μm ×1μm square is formed in the silicon dioxide film 2 by patterning process. Further, boron ions $B^+$ are implanted into the single crystalline silicon substrate 1 with the silicon dioxide film 2 as a mask under the conditions that the acceleration voltage is 35 keV and the does is 33 $10^{16}$ cm$^{-2}$. By this ion implantation, an impurity diffusion layer 4 as shown in FIG. 1C can be formed at the hole location in the semiconductor substrate 1. Thereafter, the semiconductor substrate is annealed at 550° C. for one hour within a dry nitrogen atmosphere with a heating furnace. A resistor heating furnace is used as this heating furnace. Further, the surface of the semiconductor substrate 1 is etched by a depth of about 100 nm by use of a mixed solution of hydrofluoric acid, acetic acid and nitric acid, so that the impurity diffusion layer 4 is dug down to about 100 nm from the surface of the silicon substrate 1 as shown in FIG. 1D. Thereafter, as shown in FIG. 1E, a conductive layer 5 of a metallic film with a thickness of about 800 nm is formed on the substrate by depositing aluminum using sputtering technique, for instance. Further, an electrode is formed by patterning this conductive layer 5 in alignment of the contact hole 3.

The measured contact resistance value between the aluminum electrode and the impurity diffusion layer formed in accordance with the method of the first embodiment is $8\times10^{-8}$ Ωcm$^2$.

In order to examine the reduction effect of the contact resistance obtained in accordance with the method according to the present invention in comparison with that obtained in accordance with the conventional method, boron ions are implanted into a semiconductor substrate under the same condition as above, and the semiconductor substrate is annealed within a nitrogen atmosphere (the annealing temperature is 900° C.; the annealing time is 30 min; and the impurity diffusion layer 4 is not etched). The measured result of the contact resistance value is $4\times10^{-7}$ Ω cm$^2$. This indicates that in the method according to the present invention, the contact resistance value can reduced markedly as compared with that obtained in accordance with the conventional method.

Further, in the case where the surface of the semiconductor substrate is not etched by the mixed solution in the method of present invention, the contact resistance is $1\times10^{-7}$ Ω cm$^2$. This indicates that although the contact resistance value is higher than the case where the etching is effected, the contact resistance value can be reduced down to ¼, as compared with the case of the prior art method. Further, roughly the same contact resistance value as described above can be obtained with respect to the contact holes of different sizes.

Further, in the method of the present invention, when the contact hole is formed by digging down the surface of the impurity diffusion layer 4 by etching the surface of the semiconductor substrate with the use of a mixed solution without any annealing after the boron ion implantation, the contact resistance value is $8\times10^{-8}$ Ω cm$^2$. This indicates that the contact resistance value can be also reduced markedly in the above-mentioned case.

Figure 2:
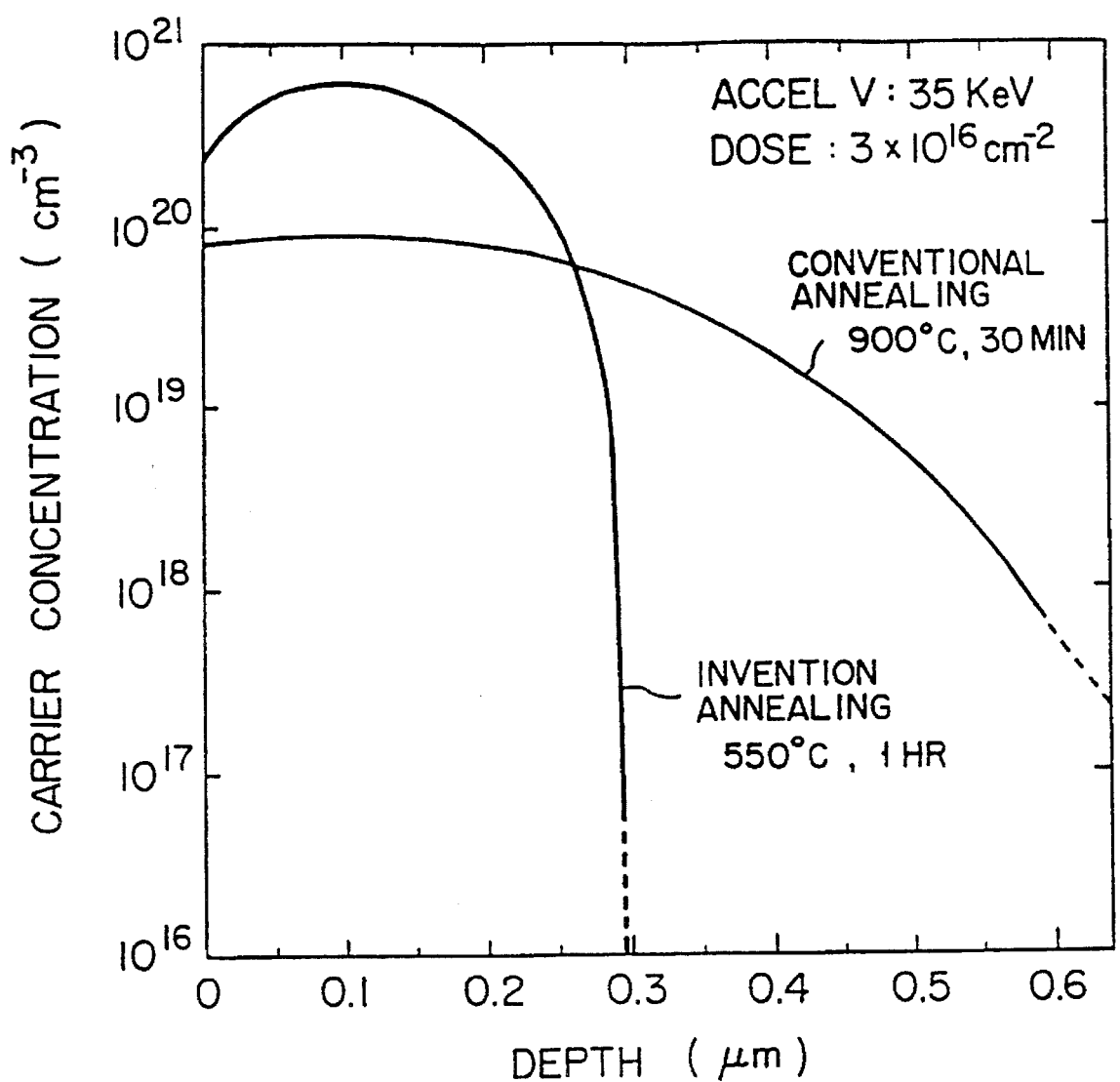
FIG. 2 is a graphical representation showing a profile of the carrier concentration in the depth direction at the contact portion of the semiconductor device according to the present invention, in comparison with that of the prior art semiconductor device.

Then, the carrier concentration at the contact portion formed in accordance with the method according to the present invention; that is, the profile of the concentration of the activated impurity atoms in the depth direction can be examined by measuring the hole concentration. FIG. 2 shows the checked profile thereof, which indicates that a carrier concentration as high as $6\times10^{20}$ cm$^{-3}$ can be obtained near the surface of the contact hole under the condition of the present invention. In contrast with this, in the prior art method by which the substrate is annealed at 900° C. for 30 min within a nitrogen gas atmosphere, the carrier concentration at the contact portion is as low as about $1\times10^{20}$ cm$^{-3}$.

In addition, in order to examine the relationship between the annealing after ion implantation and the etching in details, the carrier concentration profile is examined for the samples in which the ions are implanted under the same conditions as with the case of the method of the present invention (i.e. boron ions are implanted into the single crystalline silicon substrate under the conditions that the acceleration voltage is 35 kev and the dose is $3\times10^{16}$ cm$^{-2}$) and thereafter the annealing is effected at 550° C. within a nitrogen atmosphere for various hours, in comparison with the case where no annealing is effected. The examined results are shown in FIG. 3.

FIG. 3 indicates that it is possible to obtain a carrier concentration as high as about $6\times10^{20}$ cm$^{-3}$ at the depth position of about 0.1 to 0.15 μm, irrespective of the presence or absence of the annealing and the time duration of the annealing. Further, this graph indicates that when no annealing is made, the carrier concentration is as low as $1\times10^{19}$ cm$^{-3}$ at the surface; however, when one-hour annealing is made, the carrier concentration can be increased up to as high as about $2\times10^{20}$ cm$^{-3}$.

Therefore, it is possible to realize the contact resistance value less than $1\times10^{-7}$ Ω cm$^2$, which may be required for the future semiconductor devices sufficiently to be microminiaturized, by determining the carrier concentration to be more than $2\times10^{20}$ cm$^{-3}$ on the surface of the impurity diffusion layer obtained before the contact hole is formed, irrespective of the presence or absence of the etching process.

Figure 4:
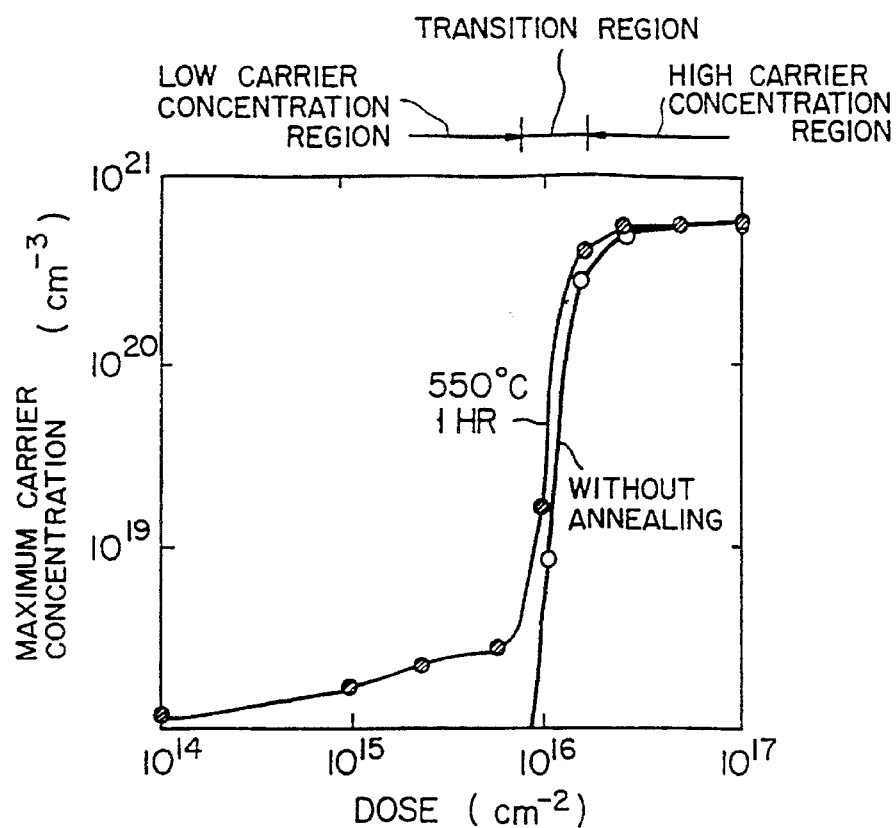
FIG. 4 is a graphical representation showing the relationship between the maximumcarrier concentration and the dose obtained when the device samples are ion-implanted in various doses and annealed at 550° C. within a nitrogen atmosphere for one hour, in comparison with that obtained before annealing.

Further, FIG. 4 shows the relationship between the maximum carrier concentration and the dose obtained from the measurement results of the carrier concentration profiles. These carrier concentration profiles are obtained by use of the samples formed by implanting boron ions into a single crystalline silicon substrate at 35 kev in various doses and annealed at 550° C. for one hour within a nitrogen atmosphere, in comparison with the samples formed without annealing.

This graph indicates that it is possible to obtain a region at which the a carrier concentration is as high as $2\times10^{20}$ cm$^{-3}$ or more with a transition region between a low carrier concentration region and the high concentration region, irrespective of the annealing at 550° C. for one hour within the nitrogen atmosphere, as far as the dose is $1.5\times10^{16}$ cm$^{-2}$ or more. Further, the graph indicates that the maximum carrier concentration of $4\times10^{20}$ cm$^{-3}$ can be easily realized.

Further, it is understood that the boron peak concentration obtained when boron is ion-implanted at an acceleration voltage of 35 keV and in dose of $1.5\times10^{16}$ cm$^{-2}$ is $1.5\times10^{21}$ cm$^{-3}$, and further a boron peak concentration more than $1.5\times10^{21}$ cm$^{-3}$ is necessary, irrespective of the acceleration voltage, in order to obtain the maximum carrier concentration more than $2\times10^{20}$ cm$^{-3}$. In this case, it is proved that 60% or more of boron ions are included in the clusters composed of 12 boron atoms.

Figure 5:
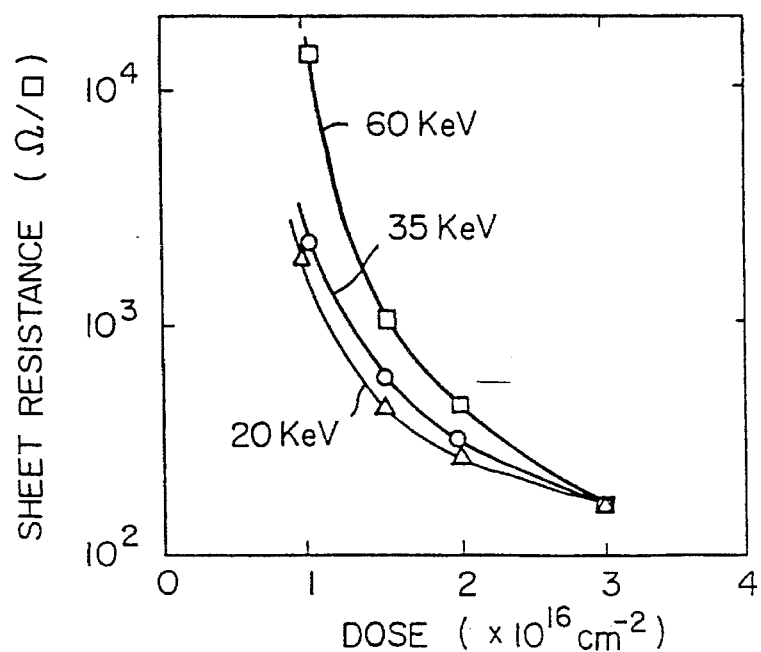
FIG. 5 is a graphical representation showing the relationship between the sheet resistance and the dose with the acceleration voltage for ion implantation as a parameter.

Further, in order to examine the relationship between the acceleration voltage for implanting ions and the sheet resistance, the sheet resistance values are measured immediately after ion implantation with respect to the various acceleration voltages of 35, 20 and 60 keV. FIG. 5 shows the relationship with the sheet resistance value as the ordinate and with the boron dose as the abscissa. This graph indicates that in order to obtain the sheet resistance roughly the same as $5\times10^2\Omega/\square$ obtained at the acceleration voltage of 35 keV and in dose of $1.5\times10^{16}$ cm$^{-2}$, the dose of $1.3\times10^{16}$ cm$^{-2}$ is necessary at the acceleration voltage 20 keV, and the dose of $1.8\times10^{16}$ cm$^{-2}$ is necessary at the acceleration voltage 60 keV. When the boron acceleration voltage increases, the spread of implanted boron ions in the depth direction are increased.

Figure 6:
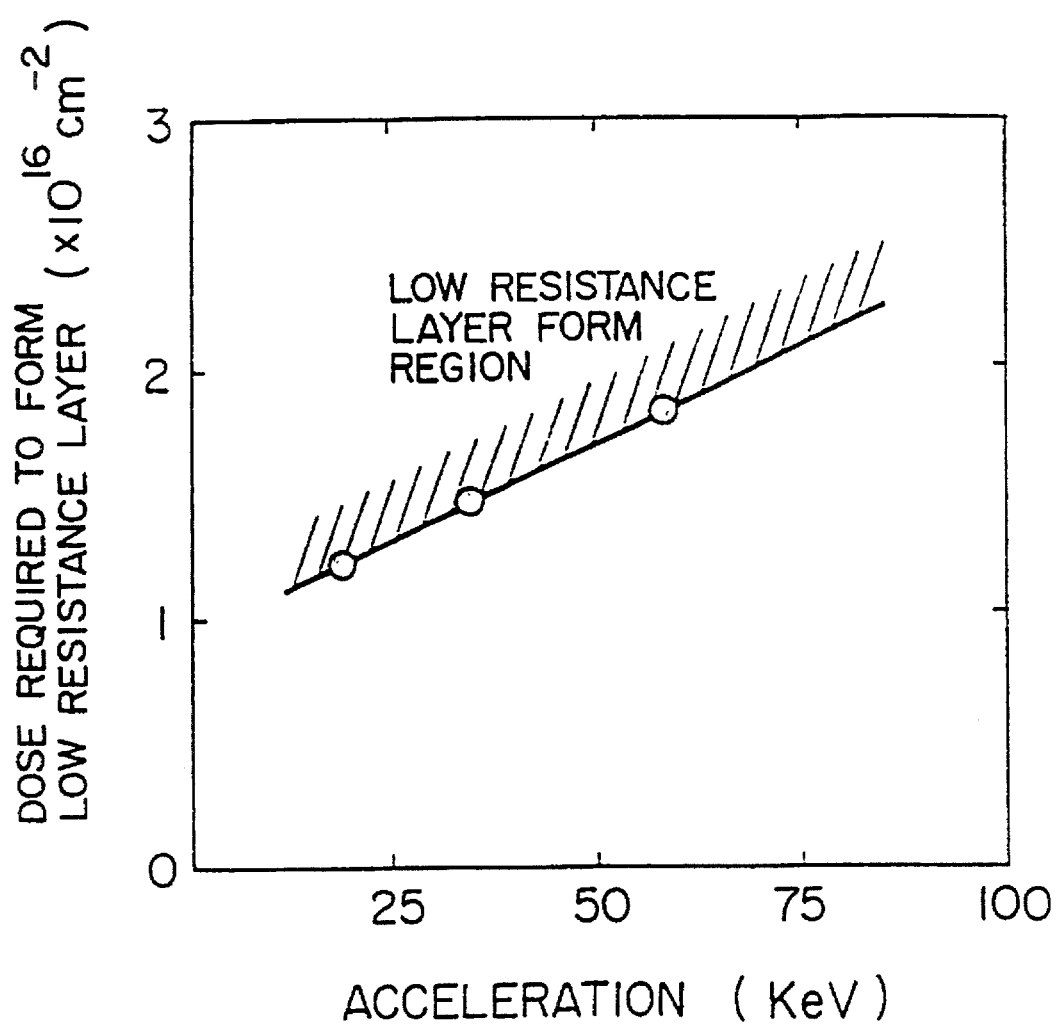
FIG. 6 is a graphical representation showing a range in which a low resistance layer can be formed.

Further, FIG. 6 shows the relationship between the dose required to form the low resistance layer and the acceleration voltage. This graph indicates that the dose required to obtain the low resistance layer increases with increasing acceleration voltage, with the result that the shape of the low resistance layer is dependent upon not only the dose of all the implanted boron ions but also the concentration of existing boron atoms. The acceleration voltage is not particularly limited, however, it is possible to apply 5 to 100 keV now being used in practice.

Figure 7:
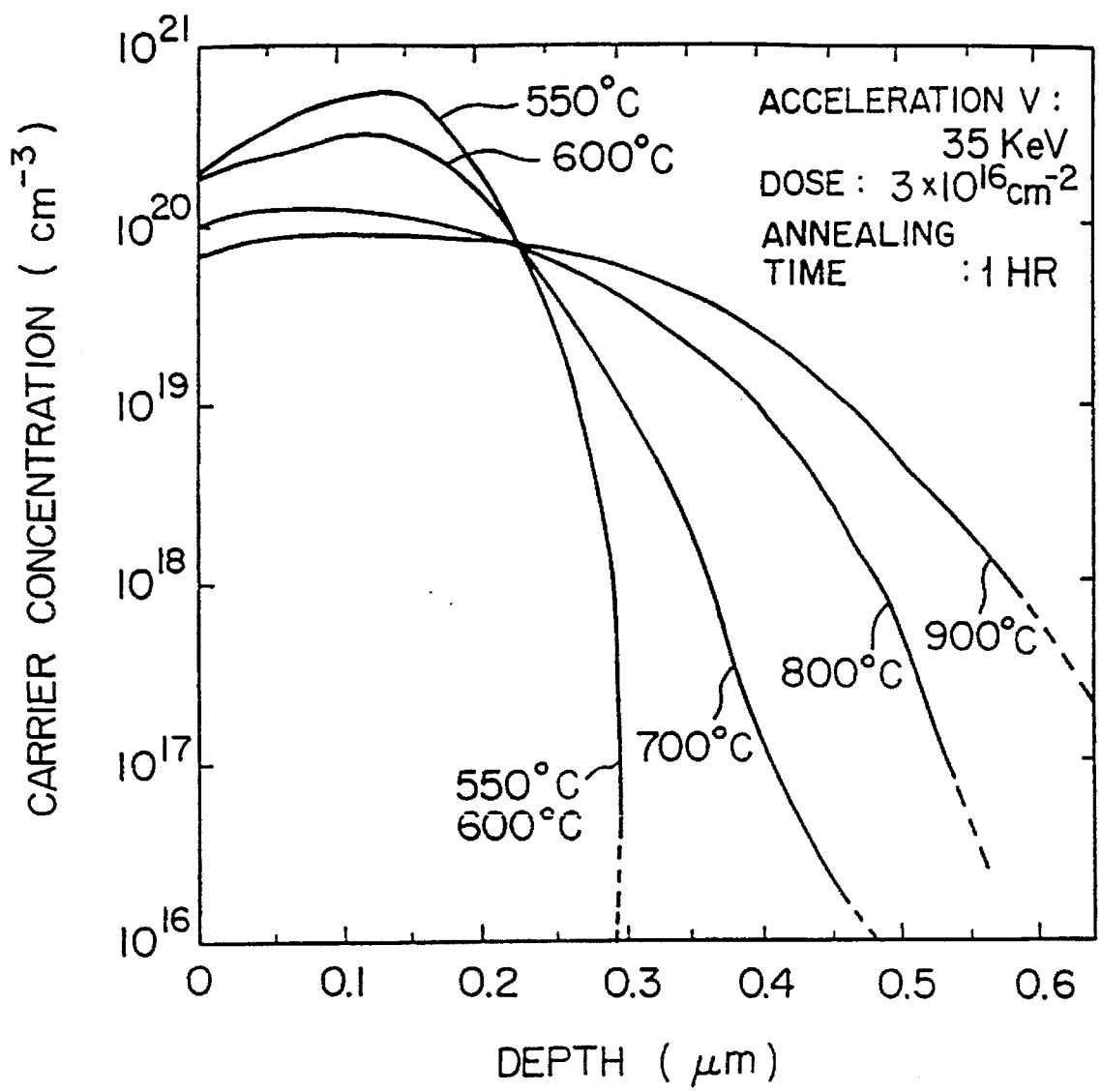
FIG. 7 is a graphical representation showing profiles of carrier concentration in the depth direction obtained with the annealing temperature as a parameter.

Further, FIG. 7 shows the carrier concentration profiles of the impurity diffusion layer 4 in the depth direction, which are obtained when boron ions are implanted into single crystalline silicon substrates at an acceleration voltage of 35 keV and in a dose of $3\times10^{16}$ cm$^{-2}$ and further the substrates are annealed for one hour at various temperatures. The graph indicates that the carrier concentration at the depth of about 0.1 to 0.15 μm from the surface of the impurity diffusion layer 4 decreases with increasing the annealing temperature.

As shown in FIGS. 3 and 7, the maximum carrier concentration is obtained when the substrate is annealed at 600° C. or less or when no annealing is performed. Therefore, the higher carrier concentration in the surface of the semiconductor substrate can be realized by etching the substrate surface about 100 nm after the annealing under the above-mentioned conditions. As a result, in the method of the present invention, a high carrier concentration layer 4 can be formed at the contact portion shown in FIG. 1, and the contact resistance value can be reduced down to $8\times10^{-8}$ cm$^2$.

Further, even at a annealing temperature of 700°C., since the depth of the diffusion layer is not increased and additionally the maximum carrier concentration is $2\times10^{20}$ cm$^{-3}$ or more, there exists no specific problem when the contact resistance is reduced. On the other hand, as shown in FIG. 7, when the annealing temperature is 700°C. or higher, since boron atoms are inner-diffused and further deactivated, the carrier concentration is decreased. However, the carrier concentration value obtained at 700° C. is superior to the prior art carrier concentration value obtained by annealing the low-dose (e.g. $1\times10^{16}$ cm$^{-2}$ or less) ion-implantation layer at 700°C.

Further, when the silicon ions are implanted; the surface thereof is formed into an amorphous state; and further the boron ions are implanted, being different from the method of the present invention, neither of the high carrier activation immediately after the ion implantation nor the remarkable electrical behavior with the dose of $1\times10^{16}$ cm$^{-2}$ as a boundary are observed. This indicates that the ion implantation under the crystal (single crystalline or polycrystalline) condition is indispensable to form the high carrier concentration layer at a low temperature.

Here, the reason why such a remarkable effect that the shallow diffusion layer of high carrier concentration can be formed when annealing temperature was lower than 700° C. (more preferably lower than 600° C.) as described above is further studied.

First, in order to examine the boron status, the acceleration voltage is fixed at 35 keV; and boron ions are implanted into a single crystalline silicon substrate in doses of $3\times10^{16}$ cm$^{-2}$, $5\times10^{16}$ cm$^{-2}$ and $1\times10^{17}$ cm$^{-2}$. The infrared absorption spectrum has been measured for the respective samples.

Figure 8:
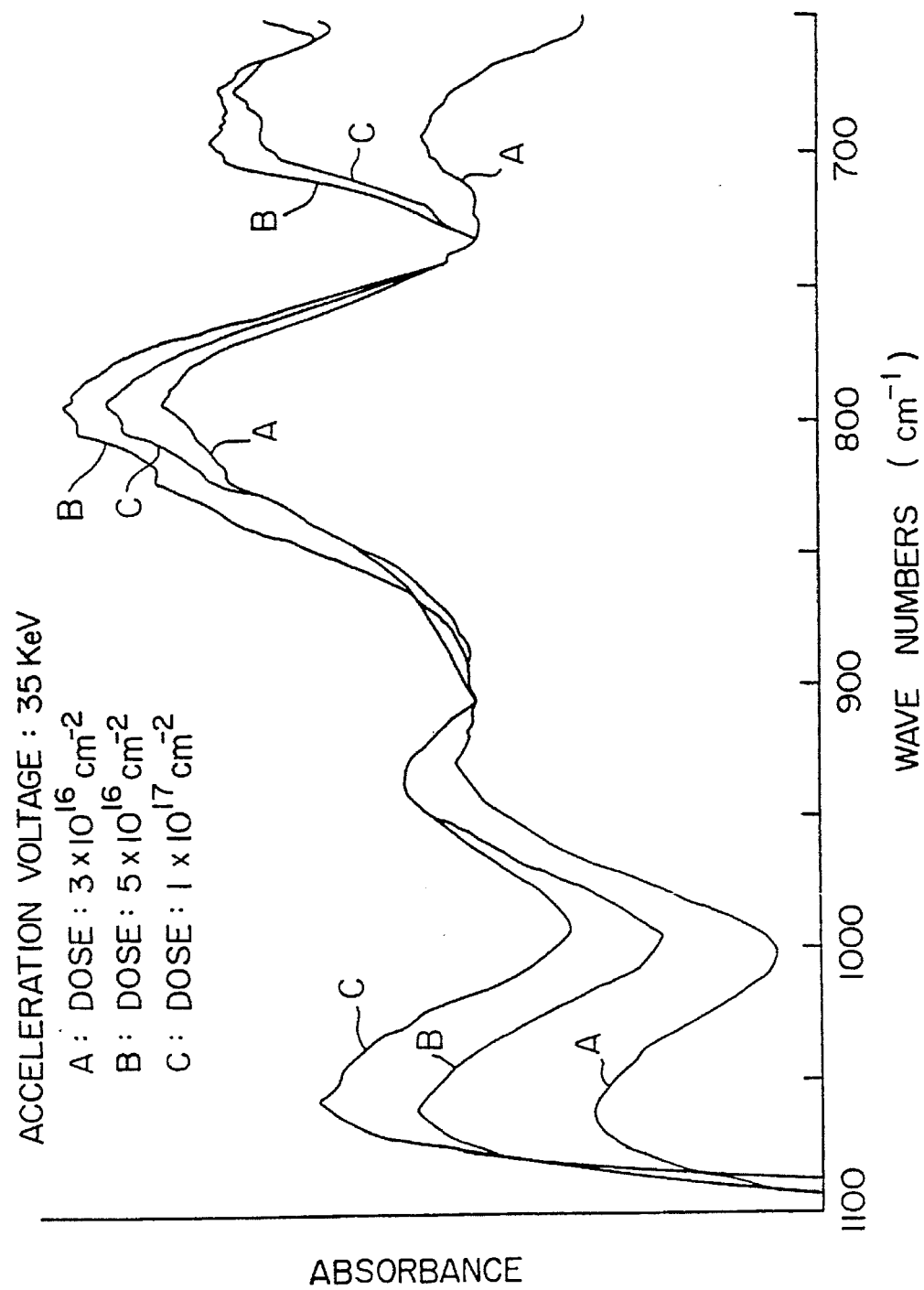
FIG. 8 is a graphical representation showing the result obtained by infrared absorption spectrum measurement method.

FIG. 8 shows the measured results. In the drawing, the three absorption degree characteristic curves of the respective doses are displayed being collected near the wave numbers of 900 cm$^{-1}$ and 740 cm$^{-1}$. This graph indicates that the absorption degrees at the specific wave numbers of (near 680, 800 and 930 cm$^{-1}$) increase with increasing boron dose. The absorption degrees at the wave numbers correspond to the clusters of icosahedron structure each composed of 12 boron atoms. That is, a part of implanted boron ions constitute an icosahedron structure composed of 12 boron ions.

Figure 9:
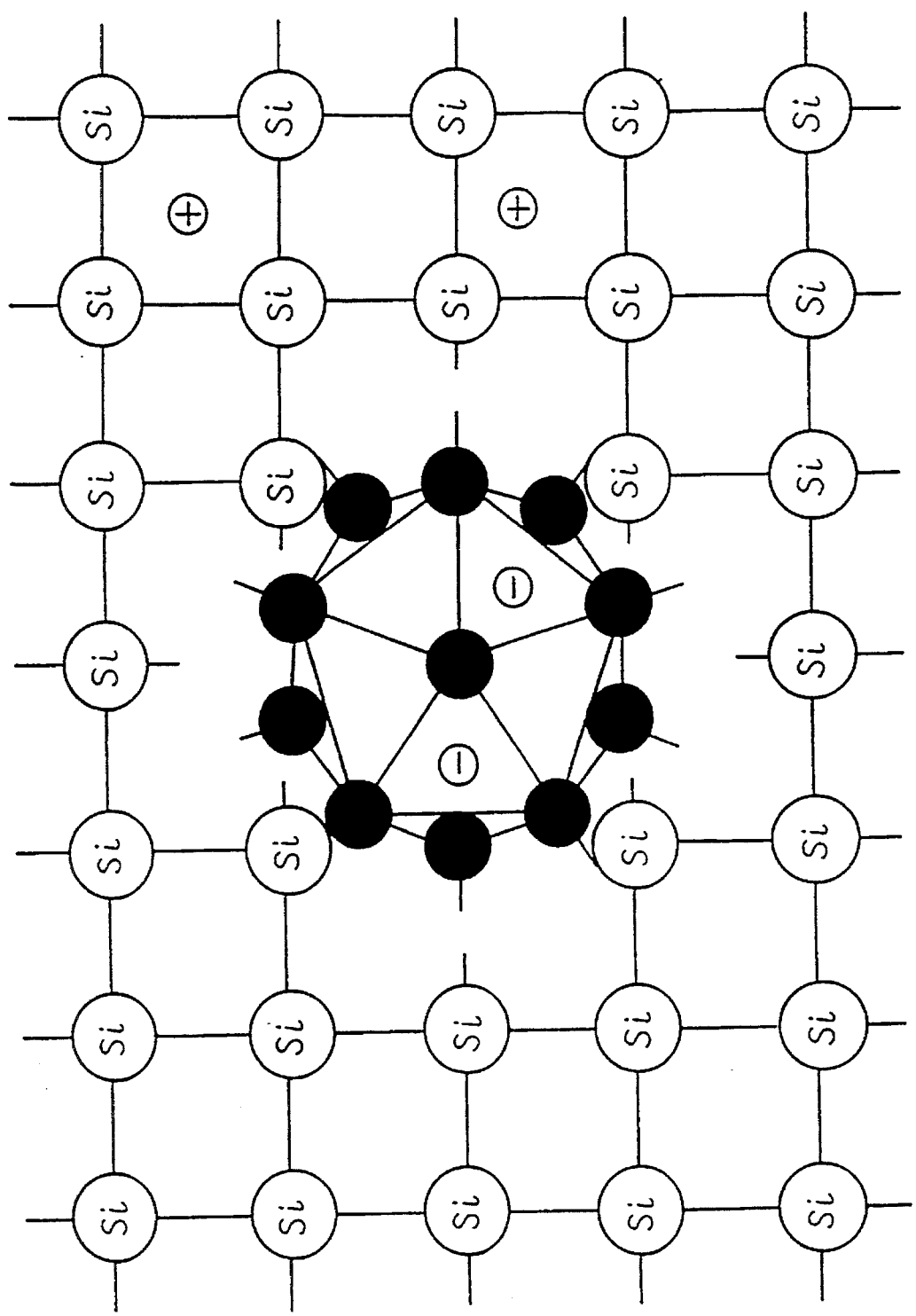
FIG. 9 is a typical illustration showing a crystal structure in which a cluster of an icosahedron structure composed of 12 boron atoms is present within a silicon crystal.

FIG. 9 shows a typical example of a cluster of an icosahedron structure composed of 12 boron atoms implanted in silicon atoms, in which 5 silicon atoms are removed from the crystal lattice of single crystalline silicon having a regular tetrahedron and an icosahedron structure cluster is replaced with the removed silicon atoms. In this case, the difference in size between the 5 silicon atoms and the boron cluster of an icosahedron structure is less that 10%. The cluster of an icosahedron structure composed of 12 boron atoms has 12 unpaired electrons; on the other hand, the single crystalline silicon lattice from which 5 atoms are removed has 12 unpaired electrons, so that it is possible to realize a replacement without providing any dangling bond.

In the above-mentioned spectrum absorption measurement, when boron ions are implanted into the silicon substrate, the substrate is cooled by water to keep the substrate temperature between the room temperature and 80° C. Further, to check the influence of the substrate temperature, the substrate is cooled by liquid nitrogen before the boron ion implantation. As a result, the infrared absorption characteristics representative of the presence of clusters composed of boron atoms are not found. This may be due to the fact that when the substrate is cooled, the layer into which ions are implanted is changed into amorphous state.

Figure 10:
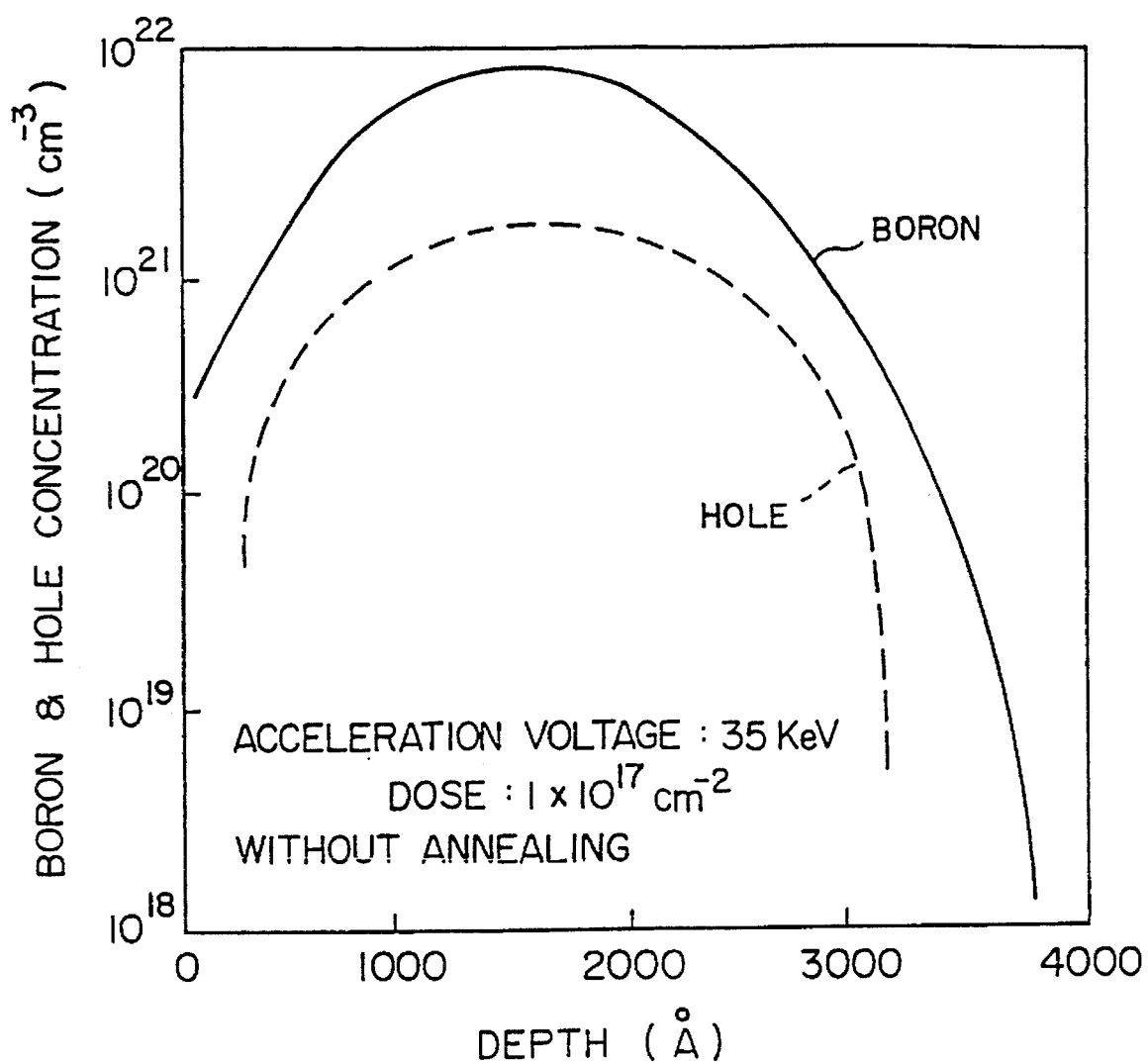
FIG. 10 is a graphical representation showing profiles of boron and carrier concentrations in the depth direction obtained when boron ions are implanted into the substrate.

FIG. 10 shows the boron and carrier concentrations in the depth direction from the surface of the semiconductor substrate. The substrate samples are obtained by implanting boron ions at temperature kept between the room temperature and 80° C. Further, these semiconductor substrate samples were not annealed.

Figure 11:
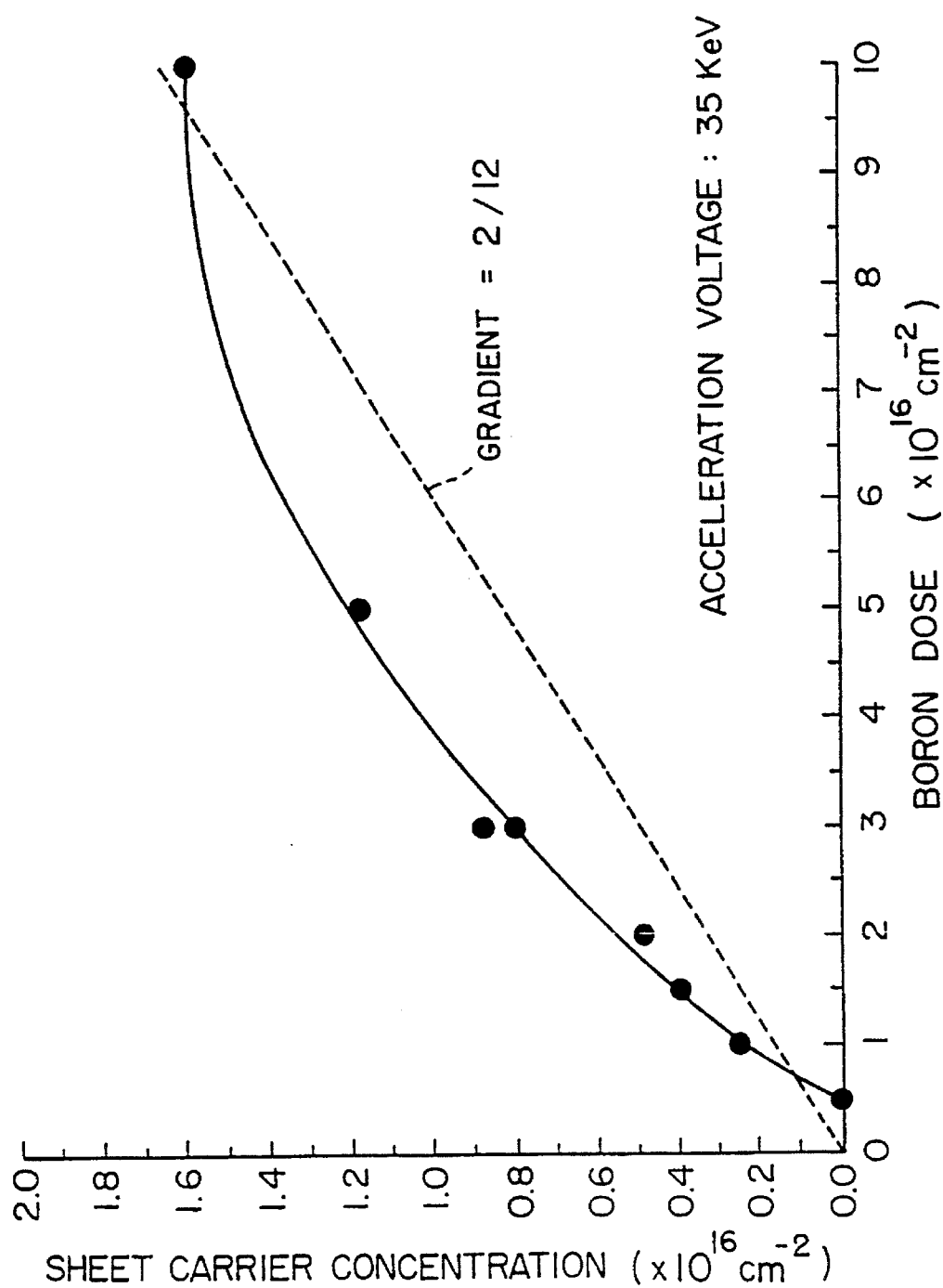
FIG. 11 is a graphical representation showing the relationship between the sheet carrier concentration and the boron dose.

FIG. 11 shows a characteristic curve representative of the relationship between the carrier concentrations and the doses. In this drawing, the carrier concentrations are measured for various samples of different doses. FIG. 11 indicates that it is possible to obtain a hole conductive semiconductor substrates of high carrier concentrations if the boron dose is $1 \times 10^{16}$ cm$^{-2}$ or more, and further the carrier concentration is roughly one-sixth (⅙) of the boron dose.

Figure 12:
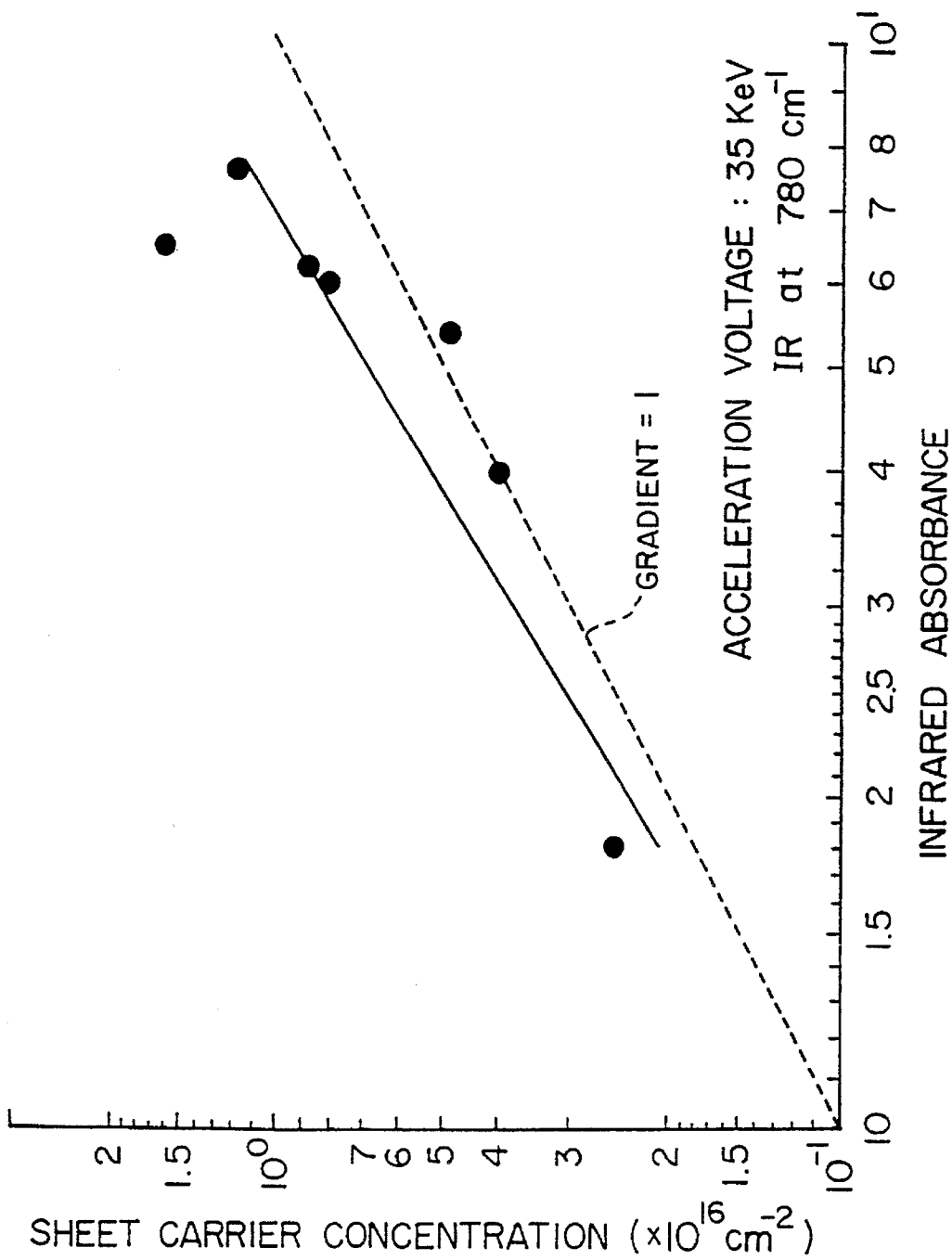
FIG. 12 is a graphical representation showing the relationship between the sheet carrier concentration and the infrared absorption intensity caused by the presence of the clusters each composed of 12 boron ions.

Further, on the basis of the spectrum characteristics shown in FIG. 8, the intensity of absorption due to the presence of the clusters of icosahedron structure each composed of 12 boron atoms are checked in relation to the sheet carrier concentration. FIG. 12 indicates that the intensity of the infrared absorption is roughly proportional to the sheet carrier concentration. This is because the clusters each composed of 12 boron atoms function as acceptors.

The above-mentioned results can be reasonably explained by considering that the cluster composed of 12 boron atoms functions as a double acceptor. In this connection, D. W. Bullet discloses that the cluster of an icosahedron structure composed of 12 boron atoms is a double ion, in AIP Conf. Proc., 170, 22 (1991), "THE ELECTRIC ORIGIN OF DISORDER IN BORON AND BORON-RICH BORIDES". This literature supports that the clusters of icosahedron structure each composed of 12 boron atoms can be produced in the above-mentioned impurity layer, and further the clusters function as double acceptors.

Figure 13:
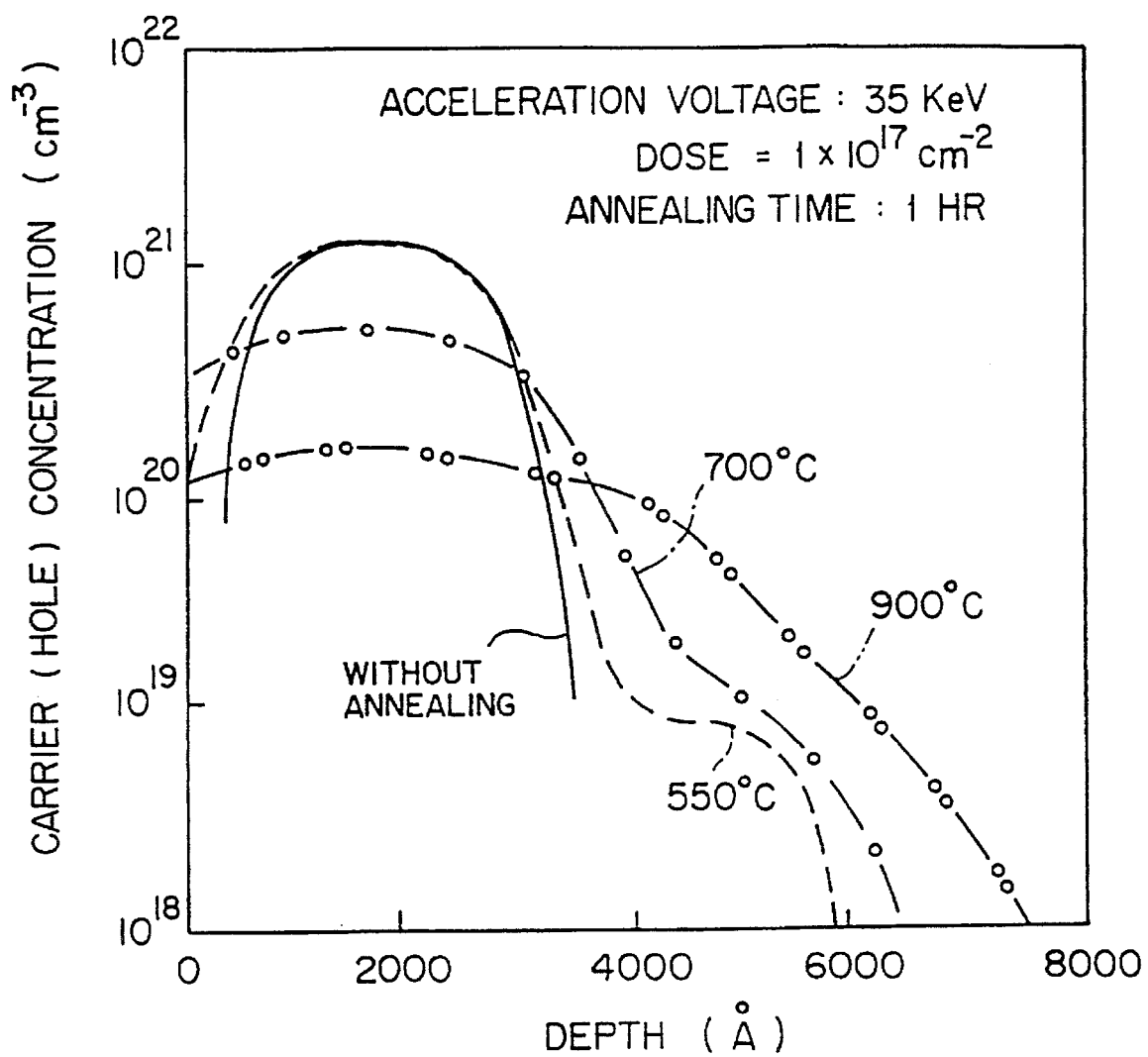
FIG. 13 is a graphical representation showing profiles of carrier concentration in the depth direction obtained when the device samples are annealed at 550° C. to 900° C. for one hour within a nitrogen atmosphere.

Further, in order to study the relationship between the above-mentioned clusters and the annealing, the samples are prepared by implanting boron ions into the substrates at 35 keV and in a dose of $1 \times 10^{17}$ cm$^{-2}$. Some samples are not annealed; and some samples are annealed within a dry nitrogen atmosphere at 550° C., 700° C. and 900° C., respectively. The carrier concentrations in the depth direction are measured for these samples with the annealing temperature as a parameter. FIG. 13 shows the carrier concentration characteristic curves thus obtained. FIG. 13 indicates that the carrier concentration decreases with increasing annealing temperature. This can be explained by considering that the clusters each composed of 12 boron ions do not function as double acceptors. This is because when the clusters of icosahedron structure each composed of 12 boron atoms are combined with silicon, two boron atoms among 12 boron atoms are replaced with silicon atoms, so that a chemical compound with a structure of $B_{10}Si_2$ can be obtained. This compound is electrically neutral and will not function as acceptors. Therefore, in order to prevent the clusters of icosahedron structure each composed of 12 boron atoms from being decreased, it is important not to set the annealing temperature after doping to 700° C. or higher at which the structure transformation progresses. In this case, since a structure $B_{11}Si$ in which one boron ion of 12 boron ions is replaced with a silicon atom functions as a single acceptor, annealing conditions for remaining the $B_{11}Si$ structure are effective to increase carrier concentration.

Figure 14:
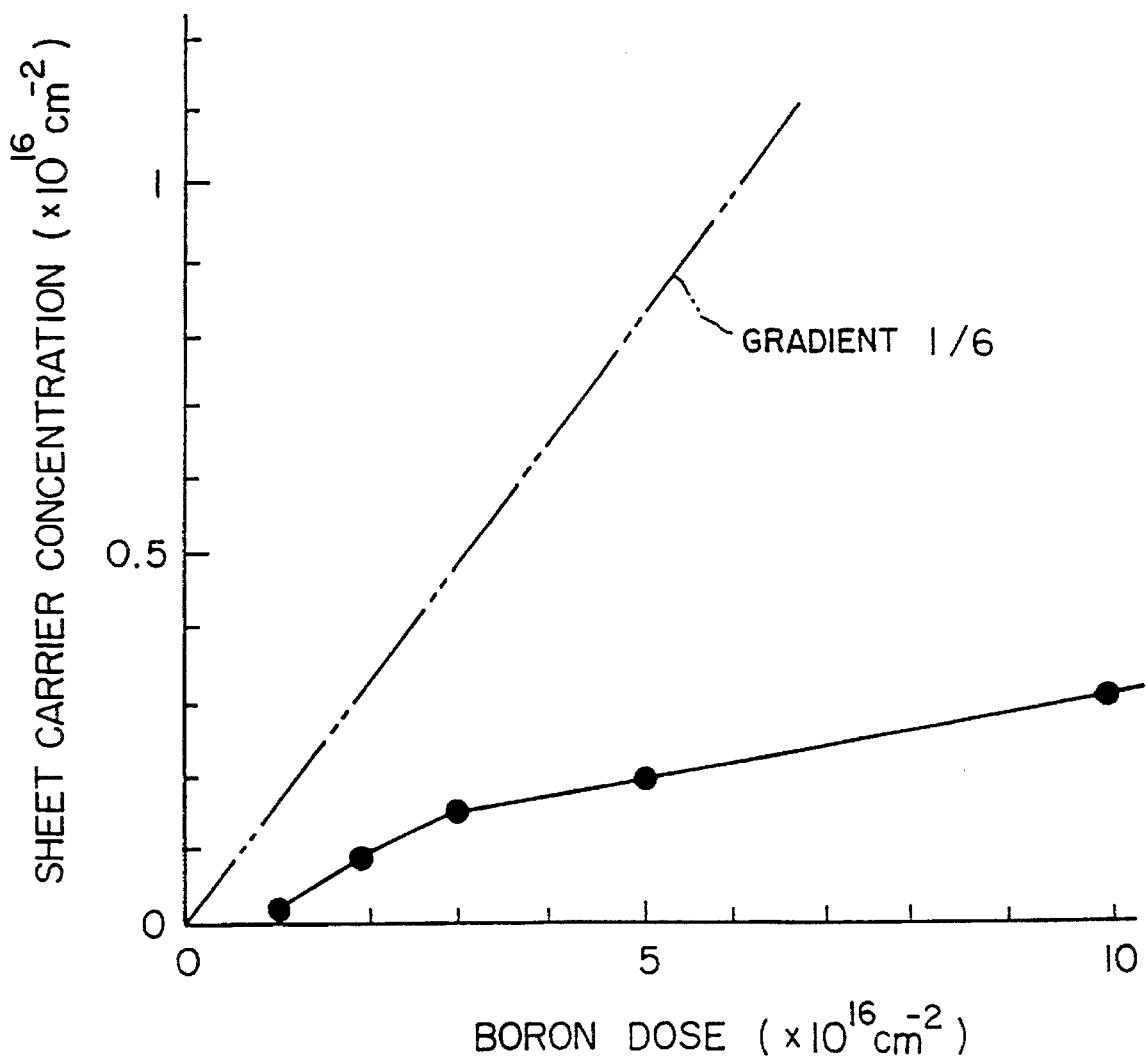
FIG. 14 is a graphical representation showing the relationship between the sheet carrier concentration and the boron dose in a polycrystalline silicon film.

Here, the relationship between the polycrystalline silicon film and the clusters of icosahedron structure each composed of 12 boron atoms will be studied. A polycrystalline silicon film with a thickness of 400 nm is formed on a thermal oxidized film with a thickness of 300 nm formed on a single crystalline silicon substrate using LP (low pressure) CVD (chemical vapor deposition) technique. Boron ions are implanted into this silicon film at an acceleration voltage of 35 keV and in a dose of $1 \times 10^{17}$ cm$^{-2}$. In this state, it is confirmed that boron atom status includes the clusters of icosahedron structure each composed of 12 boron atoms. FIG. 14 shows the relationship between the sheet carrier concentration and the boron dose.

When comparing the characteristics of polycrystalline silicon film shown in FIG. 14 with those of single crystalline film shown in FIG. 11, it is understood that the carrier concentration of the polycrystalline silicon film is lower than that of the single crystalline film in the same dose. This may be due to the fact that although the cluster of an icosahedron structure composed of 12 boron atoms function as an acceptor, the generated carriers are electrically deactivated by the presence of the crystal grain boundaries in the polycrystalline silicon.

However, it is possible to form low resistance polycrystalline silicon wiring at low temperature by utilizing the fact that it is possible to form the clusters of icosahedron structure each composed of 12 boron atoms.

Figure 15A:
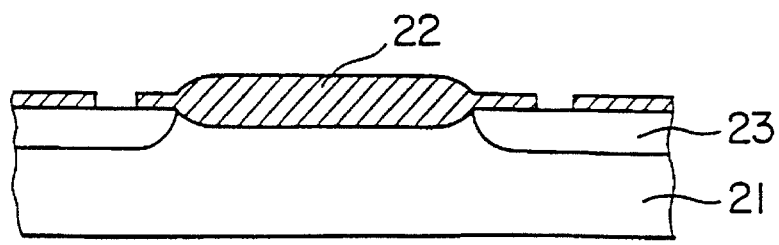
FIGS. 15A to 15E are cross-sectional views showing the process of manufacturing the semiconductor device according to the present invention, when applied to a low resistance polycrystalline silicon wiring formed at a low temperature.
Figure 15B:
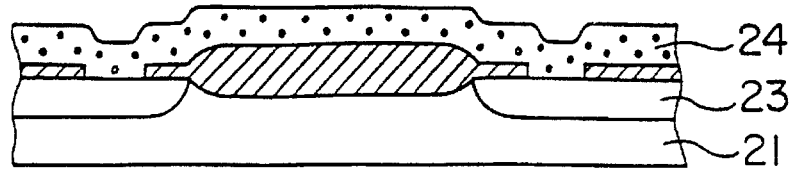
Figure 15C:
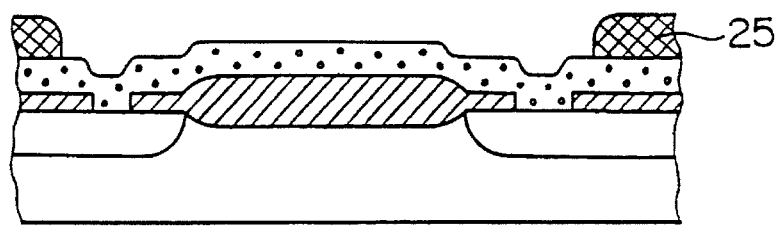
Figure 15D:
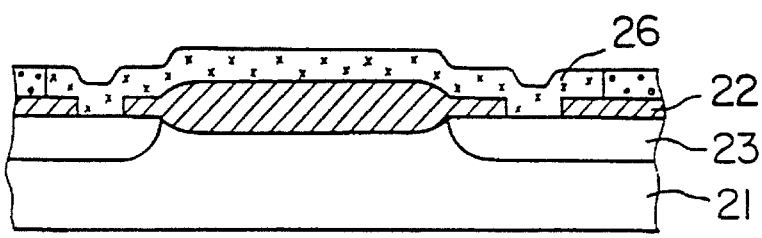
Figure 15E:
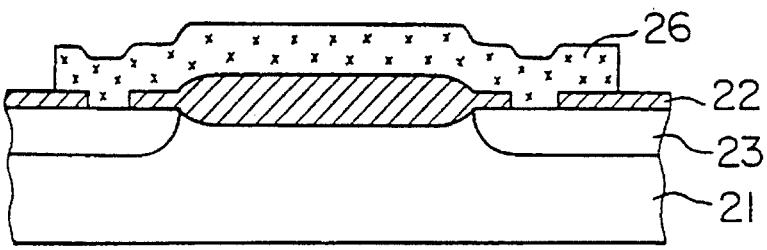

For instance, in the case of a second embodiment as shown in FIGS. 15A–15E, a silicon dioxide film 22 and a diffusion layer 23 are formed on the surface of a single crystalline silicon 21, as shown in FIG. 15A. Further, a non-dope (high resistance) polycrystalline silicon film 24 with a thickness of 200 nm in which impurity atoms are not included intentionally is deposited on the surface of the above-mentioned semiconductor device, as shown in FIG. 15B. Further, a photoresist 25 is applied thereonto and the applied photoresist is patterned so that only the area at which the resistance is to be lowered is exposed, as shown in FIG. 15C. Boron ions are implanted into the substrate thus obtained at an acceleration voltage 35 keV and in a dose of $1 \times 10^{17}$ cm$^{-2}$. As a result, only the area 26 at which boron ions are implanted becomes a low-resistance polycrystalline silicon film including boron ions at a high concentration. Further, it is possible to form polycrystalline silicon wiring through low temperature process in which the maximum process temperature does not exceed temperature for depositing polycrystalline silicon. Further, the resistivity (specific resistance) of the polycrystalline silicon is $10^{-1}\Omega$ cm at the area where boron ions are implanted, and $10^5 \Omega$ cm at the area where boron ions are not implanted. Therefore, the resistivity differs markedly between the two. Further, after the boron ions have been implanted, the area where ions are not implanted may be removed or not removed according to the structure of device elements. Further, FIG. 15E shows an example where the device is patterned so that only the low resistance polycrystalline silicon film 26 remains.

Here, the case will be explained hereinbelow where the clusters of icosahedron structure each composed of 12 boron atoms can be formed by use of a mixed gas. A silicon thin film including boron is deposited onto a silicon substrate from the surface of which a natural oxide film is sufficiently removed, in accordance with LPCVD technique with a mixed gas of disilane and diborane as source material. The deposition conditions are: the amount of flowing disilane is 100 SCCM; the amount of flowing diborane is 20 SCCM; the pressure is 100 mTorr; and the temperature is 570° C.

Figure 16:
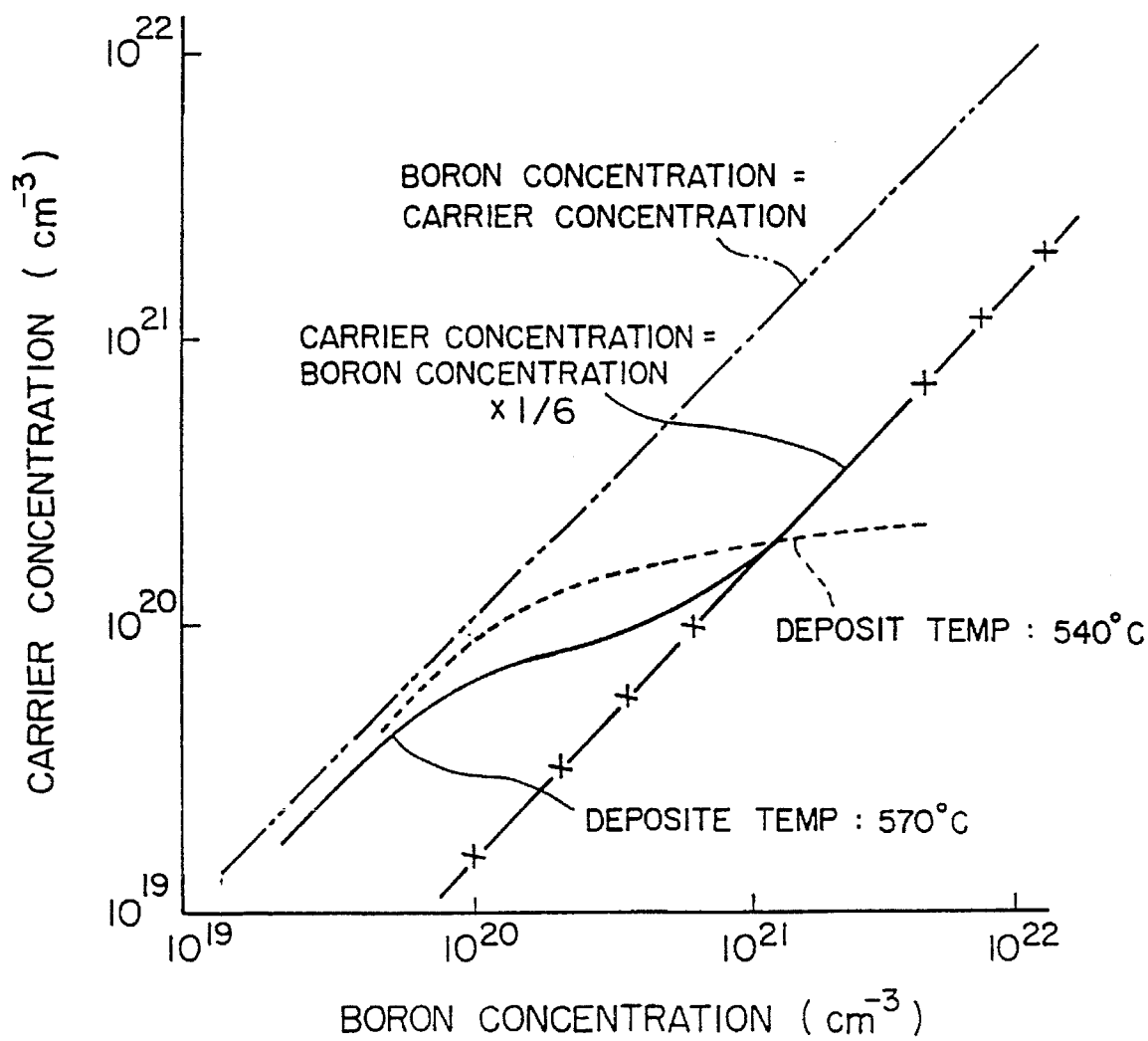
FIG. 16 is a graphical representation showing the relationship between the carrier concentration and the boron concentration in a film deposited by use of a mixed boron gas.

FIG. 16 shows the relationship between the carrier concentration and the boron concentration in the deposition film. FIG. 16 indicates that when the boron concentration is low, the carrier concentration matches the boron concentration as shown by a solid line; however, when the boron concentration is high, the carrier concentration is lower than the boron concentration down to about 1/6 of the boron concentration. This results can be well explained by considering that the clusters each composed of 12 boron atoms are formed and the formed clusters function as double acceptors, as with the case of the afore-mentioned example. In this case, the presence of the clusters composed of 12 boron atoms, respectively can be confirmed by the infrared absorption measurement.

Further, when the deposition temperature is 540° C., the relationship between the boron concentration and the carrier concentration becomes as shown by a dashed line in FIG. 16. In comparison with the case when the deposition temperature is 570° C., this dashed line indicates that the carrier concentration is extremely reduced at the area where the boron concentration is high. This may be due to the fact that when the deposition temperature is high, the diborane is easily dissolved, so that the clusters each composed of 12 boron atoms can be formed; on the other hand, when the deposition temperature is low, the diborane is not dissolved in the gaseous phase and additionally the atoms on the substrate surface are not easily moved, so that the boron clusters are not easily formed.

Further, in the above-mentioned first and second embodiments, although the boron is used as the impurity substance to be ion-implanted, the same effect can be of course obtained even when other ions such as $BF^+$, $BF_2^+$, etc. which includes boron atoms are used.

In the first embodiment, after the silicon dioxide film is deposited, the ion-implantation and the annealing are achieved. However, it is possible to achieve the ion-implantation and annealing before the silicon dioxide film has been deposited. Further, various etching techniques such as dry etching can be adopted to etch the silicon surface. Further, the silicon dioxide film can be replaced with another film such as a silicon nitride film, for instance.

As the metal used for the electrode, not only various metals such as copper, tungsten, titanium, etc. but also any conductive compounds can be used without being limited to only aluminum. In particular, when a compound including silicon such as silicide is used as the electrode or the base material for the electrode, since the interface between the compound and the silicon can be located within the region where impurity atoms are activated by the reaction between the two generated when the compound is formed, it is possible to eliminate the etching process for the substrate surface. In this case, for instance, after boron ions have been implanted into a substrate; nickel is sputtered thereonto; the substrate is annealed at 550° C. to alloy the sputtered nickel with the substrate silicon, so that a nickel silicide layer can be Further, the method of the present invention can be of course applied to the contacts between two semiconductors.

Further, the method of forming the activated impurity layer shallow in diffusion and high in concentration as described in the first and second embodiments can be of course applied to the method of forming a diffusion layer of the semiconductor device.

Figure 17A:
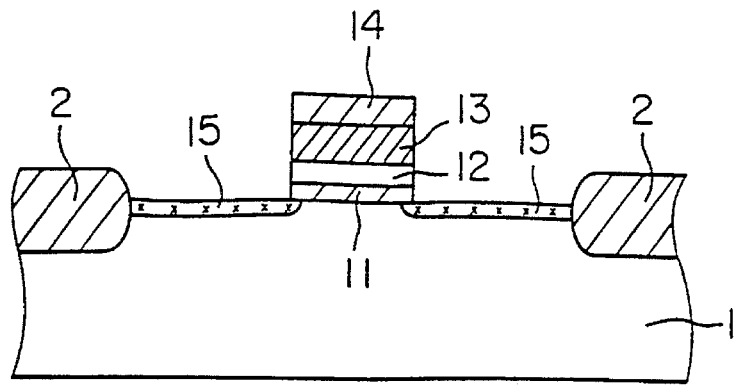
FIGS. 17A to 17C are cross-sectional views showing the process of manufacturing the semiconductor device according to the present invention, when applied to a MOS transistor of LDD structure.
Figure 17B:
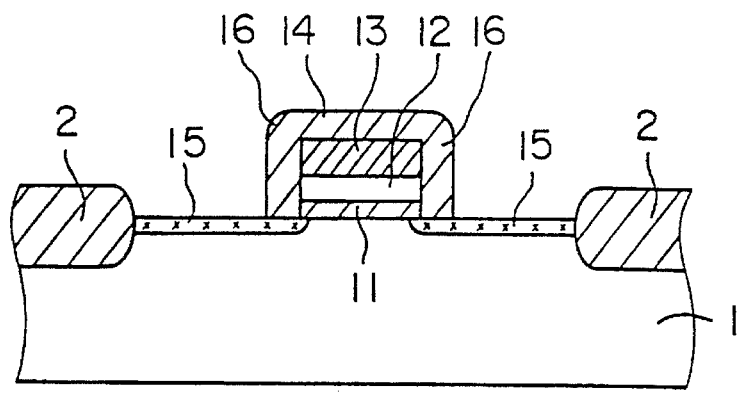
Figure 17C:
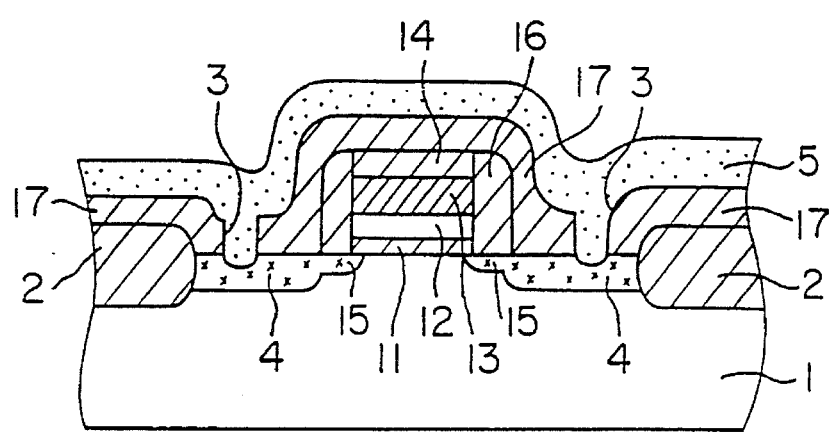

FIG. 17A–17C show the process of a third embodiment of the method of the present invention, in which the method is applied to manufacture a MOS transistor of LAD (lightly doped drain) structure. In FIG. 17A–17C, the same reference numerals have been retained for the similar elements or portions which have the same functions as with the case of the first embodiment shown in FIG. 1.

As shown in FIG. 17A, an n-type silicon substrate 1 having (100) orientation and a resistivity of 4 to 6 Ωcm is used, and further an element isolating and insulating film 2a of about 0.6 μm is formed thereon in accordance with the ordinary selective oxidization method. Successively, a gate oxide film with a thickness of 10 nm is formed thereon in accordance with the thermal oxidization method. Further, an impurity doped polycrystalline silicon film 12 with a thickness of 100 nm is formed as a gate and additionally a tungsten silicide film 13 with a thickness of 300 nm is formed as a wiring layer, in sequence. Further a silicon oxide film 14 with a thickness of 150 nm is formed on the surface thereof in accordance with the LPCVD technique. Thereafter, these films are etched by reactive etching method to pattern the gate electrode.

Further, the boron ions are implanted with the formed gate electrode as a mask to form a p-type impurity layer 15 of low concentration at a source region and a drain region. In this case, the ion-implantation conditions are as follows: the acceleration voltage is 10 keV, and the dose is $5 \times 10^{13}$ cm$^{-2}$, for instance. The annealing conditions after ion-implantation are 700° C. for 30 min.

Thereafter, as shown in FIG. 17B, a silicon oxide film 16 with a thickness of about 100 nm is formed as a gate electrode side wall. This side wall oxide film 16 can be obtained by depositing a silicon oxide film with a thickness of about 150 nm all over the surface thereof by the CVD technique and then etching all the surface thereof by the dry anisotropic etching technique.

Further, as shown in FIG. 17C, boron ions are implanted into the p-type impurity layer 15 at the source and drain regions to form a high concentration diffusion layer 4. The ion-implantation conditions are as follows: the acceleration voltage is 35 keV and the dose is $2 \times 10^{16}$ cm$^{-2}$, for instance. After ion-implantation, the substrate was not annealed.

Thereafter, a silicon oxide film 17 is formed all over the surface by the CVD technique. Further, as shown in FIG. 17C, contact holes 3 are opened in the silicon oxide film 17 by an anisotropic dry etching. After the silicon surface of the opened and exposed contact holes is etched down to 100 nm by the dry etching, an 800 nm thick aluminum film 5 including 0.5 wt. % silicon and copper, respectively is deposited. After having been patterned with this aluminum film 5 as an electrode, the device is annealed at 450° C. for 15 min within a nitrogen atmosphere including 10% hydrogen.

Further, the silicon surface can be etched by a wet etching as with the case of the first embodiment.

With respect to the MOS transistor element with a channel length of 0.8 μm, a channel width of 1, 1 μm and a contact diameter of 0.8 μm (one side) manufactured as described above, the channel resistance and the contact resistance are measured. The measured results are 2000 Ω and 2 Ω, respectively.

In contrast with this, in the case where boron ions are implanted into the exposed surface of the substrate at the source and drain regions 15, respectively at the ordinary acceleration voltage 35 keV and in the ordinary dose $5 \times 10^{15}$ cm$^{-2}$ and further the device is annealed after ion implantation at 850° C. for 30 min, the channel resistance and the contact resistance of the same element size are 2000 and 30 Ω, respectively.

As described above, in the method according to the present invention, it is possible to reduce the contact resistance of the semiconductor elements markedly. The difference between the channel resistance and the contact resistance decreases with decreasing element size. Approximately, when the element size is reduced down to 1/k, the contact resistance is increased by $k^2$ times, in spite of the fact that the channel resistance does not change. Accordingly, in the case of the elements minuter than those shown in the above-mentioned embodiments, the method of reducing the contact resistance value in accordance with the present invention becomes more effective. Further, since the process temperature is low, the method of the present invention can be preferably applied to the so-called multilayer interconnection substrates.

Further, in the above-mentioned embodiments, although the high concentration impurity layer is directly formed on the surface of the single crystalline silicon substrate, it is also possible to apply the present invention to the case where a single crystalline silicon layer is further formed on the single crystalline silicon substrate in accordance with the CVD technique to obtain a new substrate.

Furthermore, the method of the present invention can be applied to various portions at which a junction shallow in diffusion and high in activity is required, without being limited to only the contact portions.

As described above, in the semiconductor device of the present invention, since the semiconductor device includes the impurity layer including boron atoms in the form of clusters of icosahedron structure each composed of 12 boron atoms, it is possible to form the diffusion layer shallow in depth and high in activity. In addition, in the manufacturing method of the present invention, since the method includes the steps of doping boron atoms into the impurity layer of the semiconductor substrate at high concentration so that the clusters of icosahedron structure each composed of 12 boron atoms can be formed in the impurity layer so as to remain after the succeeding process, it is possible to form the diffusion layer shallow in depth and high in activity, which can improve the performance of the next generation LSIs markedly.

What is claimed is:

1. A semiconductor device comprising:

a silicon layer; and an impurity layer containing boron ions in such a way that at least a part of boron ions are contained in the form of clusters of icosahedron structure each composed of 12 boron atoms, said impurity layer being formed in said silicon layer.

2. The semiconductor device of claim 1, wherein said silicon layer is a silicon substrate.

3. The semiconductor device of claim 1, wherein said silicon layer is a polycrystalline silicon film formed on a silicon substrate.

* * * * *